United States Patent [19]

Watanabe

[11] Patent Number: 5,260,951
[45] Date of Patent: Nov. 9, 1993

[54] ERROR CORRECTION CIRCUIT FOR DIGITAL DATA

[75] Inventor: Nobuhiko Watanabe, Tokyo, Japan

[73] Assignee: Sony Corporation, Tokyo, Japan

[21] Appl. No.: 886,656

[22] Filed: May 20, 1992

[30] Foreign Application Priority Data

May 24, 1991 [JP] Japan .................... 3-149788

[51] Int. Cl.⁵ .............................. H04L 7/00
[52] U.S. Cl. ........................ 371/41; 371/5.1
[58] Field of Search ............. 371/36, 37.9, 41, 5.1,
371/5.5, 3, 57.2; 375/94, 95, 102

[56] References Cited

U.S. PATENT DOCUMENTS 4,747,116  5/1988  Yajima et al. ............... 371/41
5,163,053  11/1992  Okumara et al. ............ 371/5.1

Primary Examiner—Vincent P. Canney
Attorney, Agent, or Firm—Jerry A. Miller

[57] ABSTRACT

A digital cellular communication system includes a plurality of error detection/correction systems for detecting and correcting errors in data encoded using any of several types of encoding. When more than one error detection/correction system produces valid data the number of corrections required to obtain valid data is used to determine which result is actually valid.

9 Claims, 2 Drawing Sheets

ERROR CORRECTION CIRCUIT FOR DIGITAL DATA

BACKGROUND

1. Field of the Invention

This invention relates to data communication system. The invention is more particularly directed to a method for reconverting digital data which is received through Time Division Duplex (TDD) process utilizing in a digital cellular communication system.

2. Background of the Invention

The TDD process is widely adopted for communication systems such as digital cellular communication systems. In the TDD process, frame by frame transmission and reception is alternatively performed by time division between a pair of movable subscribers, each using portable equipment such as telephones mounted in automobiles. In such communication, messages are relayed through a base station. The base station operates over a plurality of communication frequency channels. To communicate between a movable station and a base station, an unused channel is assigned. Then, frame by frame communication by time division is implemented over this assigned channel.

Both control signals and voice signals are transmitted in the digital cellular communication system. These signals are inserted into a frame and transmitted over the assigned channel. Depending upon the characteristics of these signals, they are encoded and inserted into the frame. By way of example the method of error correction encoding may depend upon bit length. However, the classification itself of these signals can not be specified or identified. Therefore, at the receiving side, a plurality of error correction decoding processes are implemented so that the properly decoded signals can be distinguished and determined to be corresponding transmitted signals before encoding. In case of the above example, two different decoding processes corresponding to two different error correction encoding techniques are used.

However, depending on the contents of the transmitted signals, it is possible for both of the two independent decoding processes to produce properly error corrected results. If this happens, the receiver is unable to judge which decoding result is proper. Though the above mentioned example was explained using two different signals (the voice signal and control signal of the digital cellular communication system) there is potential for the same problem to be encountered when more than two different signals are transmitted using TDD after implementing independent error correction encoding decoding to obtain the proper decoded signal.

OBJECTS AND SUMMARY OF THE INVENTION

The present invention has been accomplished to resolve the problem mentioned. It is an object to provide an improved system for data communication in which digital data can be properly reconverted (recovered.)

It is another object of the present invention to provide a system for detecting and distinguishing proper decoding of a signal when a plurality of error correction encoding and decoding methods are executed depending on characteristics of different signals, such as voice signal and control signal, and decoding of the signals can be eventually achieved by each of the methods.

In accordance with the present invention, there is provided a digital data communication system in which consecutive data frames are transmitted and received by Time Division in a selected channel and a plurality of data respectively inserted into a frame is encoded by a plurality of encoding methods for error corrections depending on characteristics of the data. The system has a circuit for determining, when received data are eventually and simultaneously decoded with proper results by independent processes using a plurality of decoding methods for error corrections corresponding to the encoding methods of error corrections provided to the received data. One of decoded signals as considered proper by detecting that.

The above and other features and advantages of the present invention will become apparent from the following description which will be given with reference to the illustrative accompanying drawings.

DESCRIPTION OF THE PREFERRED EMBODIMENTS

Figure 1A:
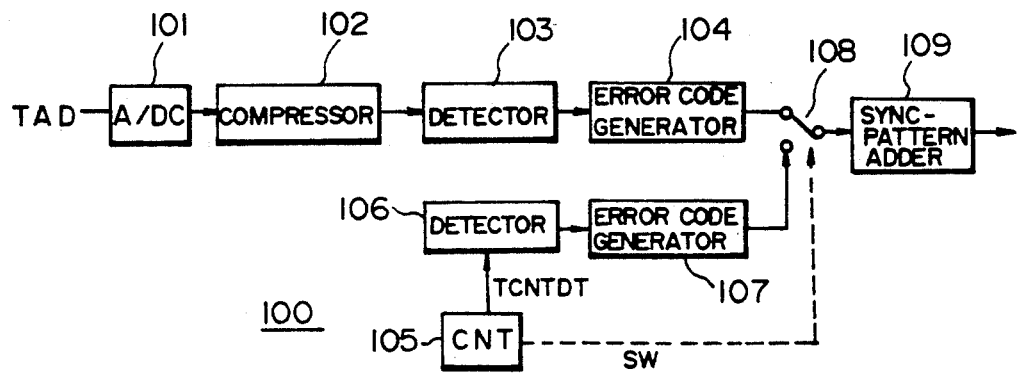
FIG. 1 is a block diagram of a movable telephone apparatus for use in the digital cellular communication system as one embodiment of the present invention, in which (A) shows transmitting circuits and (B) shows reception circuits.

Referring now to FIG. 1 shown as one embodiment of TDD communication of the digital cellular communication system, a mobile station of the digital cellular communication system such as portable telephone apparatus mounted in an automobile is illustrated where (A) shows transmitting device 100 and (B) shows receiving device 200. Though they are not shown in the drawings, those skilled in the art will understand there is apparatus fixedly mounted in a base station, corresponding to transmitting device 100 and receiving device 200.

The transmitting device 100 has an A-D (analog to digital) converter 101 for converting analog voice signal TAD to a digital signal for transmission. A signal compressor 102 compresses the digital voice signal output from the A-D converter. A detecting circuit 103 performs error detection on the voice signal. An error code generator 104, for the voice signal, performs an error correction encoding suitable for the voice signal (such as a kind of convolutional coding.) The transmitting device 100 also has a control circuit 105 to generate control signal TCNT for transmission and a detecting circuit 106 for error detection of the control signal. An error code generator 107, for the control signal, performs another error correction encoding different from the one for the voice signal but suitable for the specific control signal TCNT for transmission. The control circuit 105 controls a switching circuit 108 for selecting either the encoded voice signal output from the error code generator 104 for the voice signal or the encoded control signal output from the error code generator 107 for the control signal. The signal selected by the switching circuit 108 receives a synchronizing pattern added by a synch-pattern adder 109. The signal is then transmitted from the transmitting device 100 of the portable telephone apparatus to a receiving device of the base station.

The receiving device 200 of the portable telephone apparatus has a detector circuit 201 to detect a synchronizing pattern added by a synch-pattern adder at the base station, corresponding to the synch-pattern adder 109 of the mobile station. The receiving device 200 also includes a correction circuit 202 for the voice signal and an inspecting circuit 203 for inspecting the error detection code of the voice signal, an expansion and error-interpolation circuit 205 of the voice signal and a digital to analog converter 206. These circuits mentioned above perform the reverse operation of the circuits 101, 102, 103 and 104 of the transmitting device 100, in the opposite order. In other words, the decoding process performed by the correction circuit 202 and the inspecting circuit 203 of the voice signal corresponds to the encoding process performed by the circuits in the base station, corresponding to the detecting circuit 103 and the generating circuit 104 for the error correction of the voice signal. The receiving device 200 further includes a correction circuit 207 and an inspecting circuit 209 for inspection of the error detection code of the control signal. The decoding process performed by these circuits corresponds to the encoding process performed by the circuits in the base station, likewise corresponding to the circuits 106 and 107.

Figure 2A:
FIG. 2 illustrates format of the digital data transmitting and receiving by the apparatus shown in FIG. 1, in which (A) shows consecutive frames, (B) shows slot format mobile station to base station and (C) shows slot format base station to mobile station.

Turning to FIG. 2(A), the drawing shows an arrangement of the frames in the TDD communication system. The frames continue in turn as indicated by frame numbers N-2, N-1 and N. These frames alternatively represent a frame for transmitting from the transmitting device 100 of the portable telephone and a frame for transmitting from a transmitting device (not shown) in the base station (which is the same as a frame for receiving by the receiving device 200 of the portable telephone.)

Figure 2B:
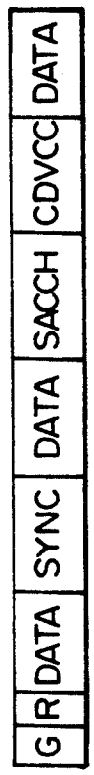
Figure 2C:
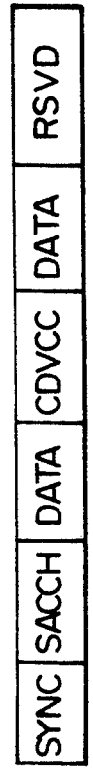

FIGS. 2(B) and 2(C) illustrate the data format in the frame N. In particular, FIG. 2(B) shows the slot format for transmission from the portable telephone to the base station. FIG. 2(C) shows the slot format for transmission from the base station to the portable telephone. In the drawings, G means "Guard Time", R means "Ramp Time", DATA means the inserted data as "User Information", SYNC means "Synchronization and Training pattern", SACCH stands for "Slow Associated Control Channel", CDVCC stands for "Coded Digital Verification Color Code" and RSVD means "Reserved." Since these terms are based on standards for the digital cellular communication system, detailed explanation is not required. The voice signal and the control signal correspond to the DATA and they are inserted into a frame after the process of Viterbi Coding depending on the characteristics of the signal.

The proper decoding operation of the embodiment is described below. In the receiving device 200 of the portable telephone shown in FIG. 1, when only the voice signal is properly decoded, no error signal ERRI is output from the inspecting circuit 203 for inspecting the error detection code of the voice signal. The expansion and error-interpolation circuit 205 of the voice signal outputs the decoded signal derived from the inspecting circuit 203 for the error detection code to the digital to analog converter 206. Thus, the properly decoded (reproduced) voice signal RAD can be obtained as the converted analog signal. Normally during the above operation, an error signal ERR2 is output from the inspecting circuit 209 of the error detecting code through an OR gate 211 to the control circuit 210 at the receiver side. Therefore, no properly decoded control signal is input to the control circuit 210.

On the other hand, when only the control signal is properly decoded, the opposite operation to the above is performed. In other words, an error signal ERRI is output from the inspecting circuit 203 of the error detecting code through an OR gate 204 so that expansion and interpolation circuit 205 of the voice signal can become inoperative. On the other side, the control signal 210 of the receiving side treats the received signal RCNTDT from the inspecting circuit 209 of the error detecting code as the properly decoded control signal. When decoding of both voice and control signals ends in failure, both error signals ERRI and ERR2 are simultaneously output so that neither the expansion and interpolation circuit 205 of the voice signal nor the control circuit 210 at the receiving side can receive the decoded signal.

Next, consider the mode in which neither of error signals ERRI nor ERR2 is generated and the result of proper decoding can be simultaneously obtained for both voice and control signals.

The receiving device 200 has a comparator circuit 208 by which the numbers of correction times N1 and N2 are compared. These numbers represent the occasions of error correction during the respective decoding and are obtained from the output of the correction circuit 202 of the voice signal and the correction circuit 207 of the control signal. The comparator circuit 208 outputs a "High" level signal when the number of correction times N2 from the correction circuit 207 of the control signal is larger than the number of correction times N1 from the correction circuit 202 of the voice signal. This "High" level signal is provided to AND gates 213 and 214, though the actual input to the AND gate 213 is an inverted "Low" level signal. The output of a NAND gate 212 is supplied to inputs of AND gates 213 and 214.

In this case, as both error signals ERR1 and ERR2 are in their "Low" level, the output of NAND gate 212 becomes "High" level. This "High" level signal is supplied to the AND gate 214 to make its output produce a "High" level signal which is in turn supplied to the control circuit 210 at the receiving side through an OR gate 211. AND gate 213 outputs its "Low" level signal to the OR gate 204. As a result, the control circuit 210 at the receiving side decides and treats the decoded control signal RCNTDT as an improper control signal received out of the inspecting circuit 209. On the other hand, the expansion and interpolation circuit 205 treats the decoded voice signal as a proper voice signal received from the inspecting circuit 203.

Those skilled in the art will understand that the decoded control signal RCNTDT is selected as a properly decoded control signal by the control circuit 210 at the receiving side when the number of correction times N2 out of the correction circuit 207 is smaller than the number of correction times N1 out of the correction circuit 202.

Figure 1B:
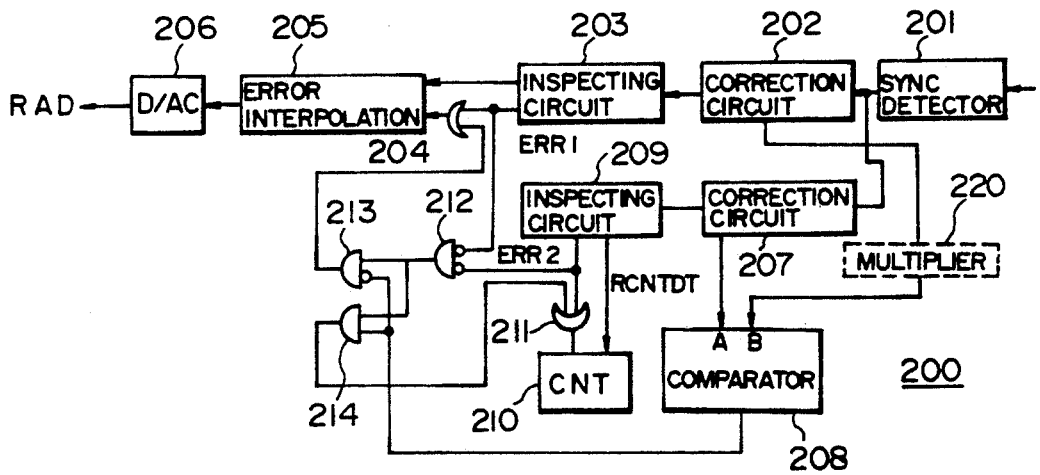

Since the characteristics such as the total bit length of the voice signal and the control signal are different from each other, the numbers of the correction times of both signals do not represent equivalent value. Therefore, there may be some occasion that a precise judgment cannot be made by the above mentioned embodiment in which the number of corrections are compared at the comparator circuit 208. To resolve this problem, a multiplier circuit 220 is added as shown in FIG. 1(B) by dotted lines, as another embodiment of the invention. The multiplier circuit 220 multiplies the number of correction times N1 from the correction circuit 202 of the voice signal by a coefficient K so that the revised number (N1×K) can become the same weight as the number of correction times N2 from the correction circuit 207 of the control signal. This revised number (N1×K) of correction times during decoding the voice signal is compared with the number of correction times N2 during decoding the control signal at the comparator circuit 208.

Accordingly, when received data are decoded by two or more processes showing proper results, a properly decoded signal can be decided by judging which of the decoded signals has a smaller number of corrections as the most appropriate decoded signal.

Though the embodiments of the invention are explained as an apparatus for the digital cellular communication system, this invention is widely applicable to digital data communication systems in which the TDD communication process is adopted and different kind of plural signals are inserted into a frame and transmitted with different encoding depending on the kind or characteristics of signal, and thereafter received and decoded by different decoding process corresponding to a different encoding process to obtain the proper signal in accordance with the result of decoding.

What is claimed is:

1. A digital data communication system in which consecutive data frames are transmitted and received by Time Division in a selected one channel and a plurality of data respectively inserted into a frame is encoded by a plurality of encoding methods for error correction comprising: determining means for determining when received data are apparently decoded without error by a plurality of decoding methods for error correction to produce a corresponding plurality of decoded signals; selecting means for selecting one of said decoded signals as properly decoded by detecting that said one of decoded signals has been decoded with fewer occasions of error correction.

2. A digital data communication system according to claim 1, wherein said plurality of data have different total bit lengths, further comprising means for weighting a number of times of said occasions for error corrections to compensate for said difference in bit lengths.

3. A digital data communication system in which consecutive data frames are transmitted by a transmitting device and received by a receiving device through time division duplex process in a selected one channel and a plurality of data, such as a voice signal and a control signal, respectively inserted into a frame is encoded by a plurality of encoding methods for error correction, comprising: determining means for determining when received data are apparently decoded without error by a plurality of decoding methods for error correction to produce a corresponding plurality of decoded signal; selecting means for selecting one of said decoded signals as properly decoded by detecting that said one of decoded signals has been decoded with fewer occasions of error corrections.

4. A digital data communication system according to claim 3, wherein said transmitting device includes independent error correction code generators for voice and control signals, and said receiving device includes independent error correction circuits for voice and control signals which generate respective output signals representing numbers of occasions of error correction during their respective decoding processes, and comparator means for comparing said numbers of occasions for detecting that said one of decoded voice or control signal, has been decoded with fewer occasions of error correction than the other.

5. A digital data communication system according to claim 4, wherein said voice signal and control signal have different bit lengths and further including a multiplier circuit for multiplying one of said numbers of times from one of correction circuits by a coefficient K so that the product has the same weight as the other number of times from the other correction circuit.

6. In an apparatus having first and second error correction circuits connected in parallel, for correcting errors in first and second types of data respectively, a device for determining which type of data has been received when both said first and second error correction circuits produce apparently valid data, comprising in combination:

first counting means for counting a first number N1 of errors corrected by said first error correction circuit;

second counting means for counting a second number N2 of errors corrected by said second error correction circuit;

comparing means for determining which number is greater N1 or N2; and means for selecting said first type of data if N1 is less than N2.

7. The device of claim 6, further comprising means for selecting said second type of data if N2 is less than N1.

8. In an apparatus having first and second error correction circuits connected in parallel, for correcting errors in first and second types of data respectively, a method for determining which type of data has been received when both said first and second error correction circuits produce apparently valid data, comprising the steps of:

counting a first number N1 of errors corrected by said first error correction circuit;

counting a second number N2 of errors corrected by said second error correction circuit;

determining which number is greater N1 or N2; and selecting said first type of data if N1 is less than N2.

9. The method of claim 8, further comprising the step of selecting said second type of data if N2 is less than N1.

* * * * *